US009244503B2

United States Patent
Yang

(10) Patent No.: US 9,244,503 B2
(45) Date of Patent: Jan. 26, 2016

(54) STORAGE DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Meng-Liang Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 278 days.

(21) Appl. No.: 14/055,910

(22) Filed: Oct. 17, 2013

(65) Prior Publication Data

US 2015/0022963 A1    Jan. 22, 2015

(30) Foreign Application Priority Data

Jul. 22, 2013    (CN) .......................... 2013 1 03077015

(51) Int. Cl.
*G06F 1/18*    (2006.01)

(52) U.S. Cl.
CPC ..................................... *G06F 1/181* (2013.01)

(58) Field of Classification Search
CPC ................. G06F 12/0246; G06F 2212/7201; G06F 13/4068; G06F 3/0679; G06F 12/00; G06F 12/0804; G06F 2212/7202; H05K 2201/10159
USPC ............. 361/679.32, 736, 737, 785, 788, 791, 361/792; 711/103, 154, E12.001, 105, 118, 711/122, 128, 173; 439/660, 638, 218, 489, 439/620.01; 710/313, 300, 305, 52
See application file for complete search history.

(56) References Cited

U.S. PATENT DOCUMENTS

| 6,792,501 | B2* | 9/2004 | Chen ...................... | G06F 3/0616 711/103 |
| 7,815,447 | B1* | 10/2010 | Chiang .............. | H01R 13/6658 439/131 |
| 8,021,166 | B1* | 9/2011 | Nguyen ........... | G06K 19/07732 439/76.1 |
| 8,432,705 | B2* | 4/2013 | Ge .......................... | G06F 1/185 361/728 |
| 8,514,604 | B2* | 8/2013 | Tian ..................... | G06F 11/3037 361/679.31 |
| 2008/0189465 | A1* | 8/2008 | Yang ..................... | G06F 13/385 710/316 |
| 2009/0210603 | A1* | 8/2009 | Chen ....................... | G11C 16/30 710/305 |
| 2009/0300259 | A1* | 12/2009 | Luo ....................... | G06F 13/385 710/313 |
| 2010/0233908 | A1* | 9/2010 | Tseng .................... | H01R 27/00 439/620.21 |
| 2011/0167177 | A1* | 7/2011 | Kouyama ............... | G06F 1/187 710/11 |

(Continued)

*Primary Examiner* — Hung S Bui
*Assistant Examiner* — Michael Matey
(74) *Attorney, Agent, or Firm* — Novak Druce Connolly Bove + Quigg LLP

(57) ABSTRACT

A storage device includes a connector with first to ninth pins, a serial advanced technology attachment (SATA) control chip, a universal serial bus (USB) control chip, and a storage chip. Voltage terminals of the SATA control chip, the USB control chip, and the storage chip are connected to the first pin of the connector. Second, third, fifth, and sixth signal terminals of the SATA control chip are connected to the fifth pin, the sixth pins, the eighth pin, and the ninth pin of the connector, respectively. Output terminals of the SATA control chip and the USB control chip are connected to a signal terminal of the storage chip. Second, third, fifth, sixth, eighth, and ninth signal terminals of the USB control chip are connected to the second pin, the third pin, the fifth pin, the sixth pin, the eighth pin, and the ninth pin of the connector, respectively.

3 Claims, 2 Drawing Sheets

(56) References Cited

U.S. PATENT DOCUMENTS

| | | | |
|---|---|---|---|
| 2012/0059977 A1* | 3/2012 | Chuang | G06F 13/1684 711/103 |
| 2012/0124266 A1* | 5/2012 | Kim | G06F 13/14 710/305 |
| 2012/0233373 A1* | 9/2012 | Ohashi | G06F 13/38 710/313 |
| 2013/0148285 A1* | 6/2013 | Liang | H05K 5/0278 361/679.31 |
| 2014/0108870 A1* | 4/2014 | Aravindhan | H01R 31/005 714/43 |
| 2014/0126138 A1* | 5/2014 | Zhang | G06F 1/185 361/679.32 |
| 2014/0204526 A1* | 7/2014 | Chen | G06F 1/16 361/679.33 |
| 2015/0121099 A1* | 4/2015 | Cheong | G06F 1/266 713/320 |

* cited by examiner

STORAGE DEVICE

BACKGROUND

1. Technical Field

The present disclosure relates to a storage device.

2. Description of Related Art

At present, universal serial bus (USB) devices and serial advanced technology attachment dual in-line memory module (SATA DIMM) devices are widely used for storing data in computer systems. However, the USB devices are convenient to carry but they have less storage capacity. The SATA DIMM devices have large storage capacity but they need to be inserted into memory slots and connected to SATA connectors of a motherboard, to receive voltages and control signals. When the number of the SATA connectors or the memory slots of the motherboard are limited, the SATA DIMM devices will not be used, and further the SATA DIMM devices are not convenient to carry. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by way of limitation. References to "an" or "one" embodiment in this disclosure are not necessarily to the same embodiment, and such references mean "at least one."

Figure 1:
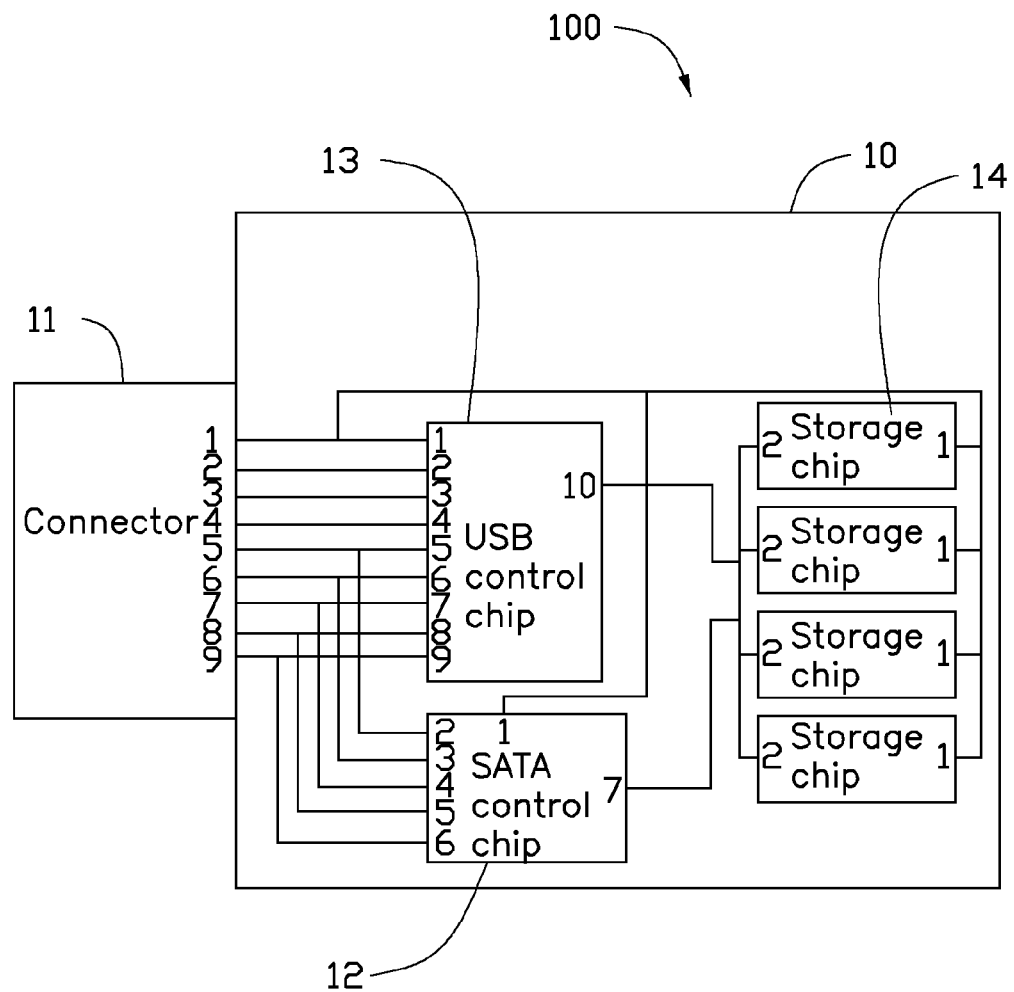
FIG. 1 is a block diagram of a storage device in accordance with an embodiment of the present disclosure.
Figure 2:
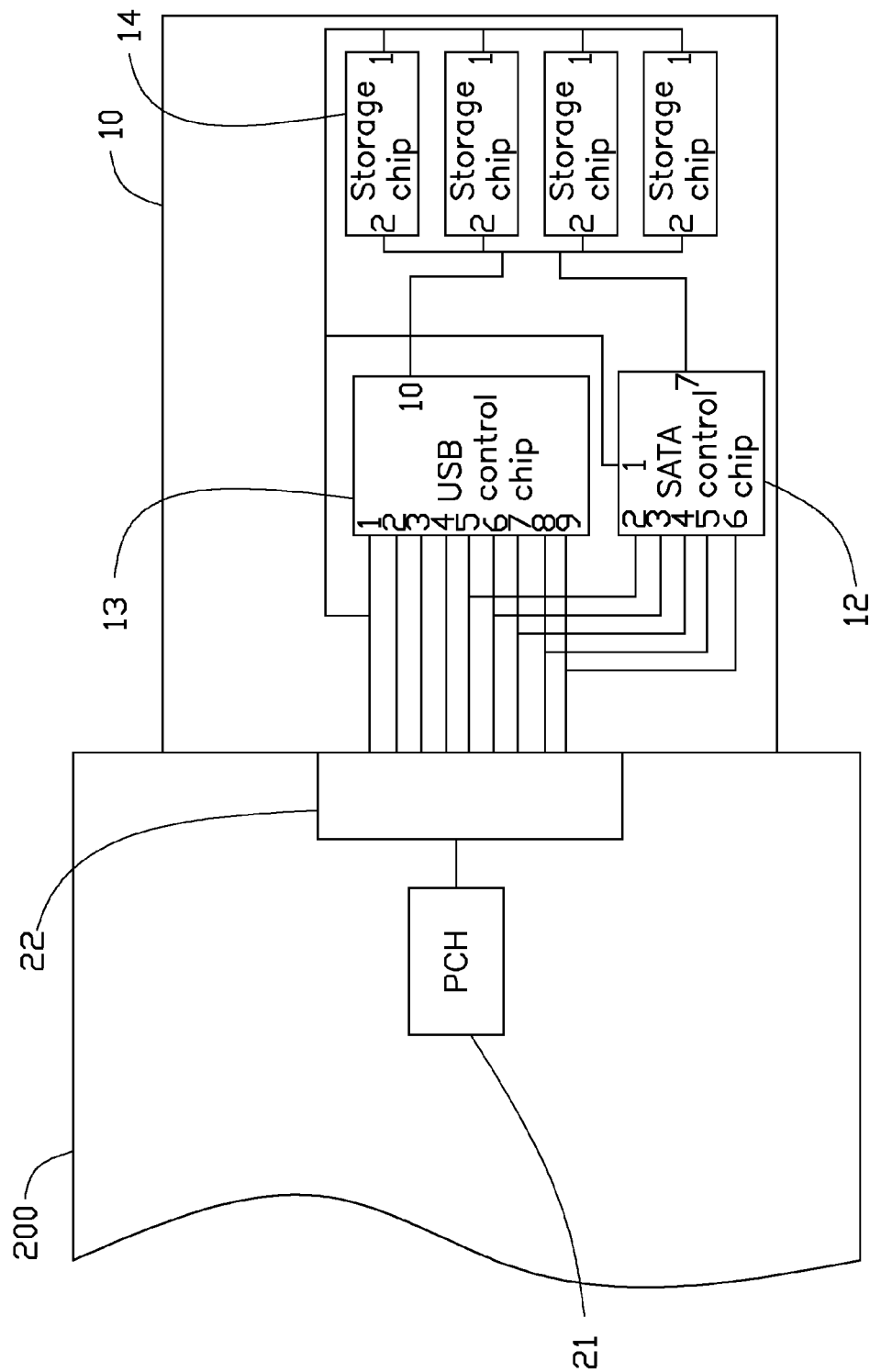
FIG. 2 is similar to FIG. 1, but shows the storage device connected to a motherboard.

FIGS. 1 and 2 show a storage device 100 in accordance with an embodiment. The storage device 100 includes a substantially rectangular circuit board 10. A connector 11, a serial advanced technology attachment (SATA) control chip 12, a universal serial bus (USB) control chip 13, and a plurality of storage chips 14 are all arranged on the circuit board 10. In one embodiment, the connector 11 is a USB3.0 connector. Wherein pin definitions of the USB3.0 connector are shown in table 1:

TABLE 1

| Pin label | Signal name | Description |
|---|---|---|
| 1 | VBUS | power |
| 2 | D− | USB2.0 differential pair |
| 3 | D+ | USB2.0 differential pair |
| 4 | GND | Ground for power return |
| 5 | StdA_SSRX− | superspeed receiving differential pair |
| 6 | StdA_SSRX+ | Superspeed receiving differential pair |
| 7 | GND_DRAIN | Ground for signal return |
| 8 | StdA_SSTX− | Superspeed transmitting differential pair |
| 9 | StdA_SSTX+ | Superspeed transmitting differential pair |
| Shell | Shield | Metal shell |

Wherein pin definitions of the SATA connector are shown in table 2:

TABLE 2

| Pin label | Signal name | description |
|---|---|---|
| 1 | GND | |
| 2 | A+ | Differential pair A |
| 3 | A− | Differential pair A |
| 4 | GND | |
| 5 | B− | Differential pair B |
| 6 | B+ | Differential pair B |
| 7 | GND | |

According to tables 1 and 2, the USB3.0 connector can cover all signals of the SATA connector. Each of the USB3.0 connector and the SATA connector includes two pair of differential lines. Furthermore, the USB3.0 connector includes a power pin, to provide a voltage to external devices. Therefore, the connector 11 can transmit SATA signals and USB bus signals.

In one embodiment, pins 1 to 9 of the USB3.0 connector are used for transmitting USB bus signal, and pins 5-9 of the USB3.0 connector are used for transmitting SATA signals.

In one embodiment, a voltage terminal 1 of the USB control chip 13 is connected to a first pin 1 of the connector 11, to receive a voltage. Ground terminals 4 and 7 of the USB control chip 13 are connected to fourth and seventh pins 4 and 7 of the connector 11, respectively, to be grounded. Signal terminals 2, 3, 5, 6, 8, and 9 of the USB control chip 13 are connected to a second pin, a third pin, a fifth pin, a sixth pin, an eighth pin, and a ninth pin 2, 3, 5, 6, 8, and 9 of the connector 11, respectively, to receive a USB bus signal. An output terminal 10 of the USB control chip 13 is connected to signal terminals 2 of the storage chips 14, to control the storage chips 14 to read or write data according to the received USB bus signal. A voltage terminal 1 of the SATA control chip 12 is connected to the first pin 1 of the connector 11, to receive a voltage. A ground terminal 4 of the SATA control chip 12 is connected to the seventh pin 7 of the connector 11, to be grounded. Signal terminals 2, 3, 5, and 6 of the SATA control chip 12 are connected to the fifth pin, the sixth pin, the eighth pin, and the ninth pin 5, 6, 8, and 9 of the connector 11, respectively, to receive SATA signals. An output terminal 7 of the SATA control chip 12 is connected to the signal terminals 2 of the storage chips 14, to control the storage chips 14 to read or write data according to the received SATA signal. Voltage terminals 1 of the storage chips 14 are connected to the first pin 1 of the connector 11, to receive a voltage. In one embodiment, the connector 11 is a male connector.

In use, the connector 11 of the storage device 100 is connected to a female connector 22 of a motherboard 200. The connector 22 is connected to a platform controller hub (PCH) 21 of the motherboard 200. When the motherboard 200 receives power, the USB control chip 13, the SATA control chip 12, and the storage chips 14 receive voltages from the motherboard 200 through the first pin 1 of the connector 11. If small capacity data needs to be stored, the PCH 21 outputs a USB bus signal by setting the basic input output system (BIOS) of the motherboard 200 to make the PCH 21 connect to the USB control chip 13 through the connectors 11 and 22. The USB control chip 13 controls the storage chips 14 to read or to write data according to the received USB bus signal.

If large capacity data needs to be stored, the PCH 21 outputs a SATA signal by setting the BIOS of the motherboard 200 to make the PCH 21 connected to the SATA control chip 12 through the connectors 11 and 22. The SATA control chip 12 controls the storage chips 14 to read or to write data according to the received SATA signal.

The storage device 100 receives a voltage and a control signal from the motherboard 200 through the connectors 11 and 22, to signal the SATA control chip 12 or the USB control chip 13, thereby controlling the storage chips 14 to read or to write data. The storage device 100 has large storage capacity and is convenient to carry.

Even though numerous characteristics and advantages of the disclosure have been set forth in the foregoing description, together with details of the structure and function of the disclosure, the disclosure is illustrative only, and changes may be made in detail, especially in matters of shape, size, and the arrangement of parts within the principles of the disclosure to the full extent indicated by the broad general meaning of the terms in which the appended claims are expressed.

What is claimed is:

1. A storage device comprising: a circuit board; a connector arranged on the circuit board and comprising first to ninth pins; a plurality of storage chips arranged on the circuit board, wherein each storage chip comprises a voltage terminal and a signal terminal, the voltage terminal of each of the plurality of storage chips is connected to the first pin of the connector, to receive a voltage; a serial advanced technology attachment (SATA) control chip arranged on the circuit board, wherein a voltage terminal of the SATA control chip is connected to the first pin of the connector, to receive a voltage, a ground terminal of the SATA control chip is connected to the seventh pin of the connector, to be grounded, second, third, fifth, and sixth signal terminals of the SATA control chip are connected to the fifth pin, the sixth pins, the eighth pin, and the ninth pin, respectively, to receive SATA signals, an output terminal of the SATA control chip is connected to the signal terminals of the plurality of storage chips, to control the plurality of storage chips to read or write data according to the received SATA signal; and a universal serial bus (USB) control chip arranged on the circuit board, wherein a voltage terminal of the USB control chip is connected to a first pin of the connector, to receive the voltage, first and second ground terminal of the USB control chip are connected to fourth and seventh pins of the connector, respectively, to be grounded, second, third, fifth, sixth, eighth, and ninth signal terminal of the USB control chip are connected to the second pin, the third pins, the fifth pin, the sixth pin, the eighth pin, and the ninth pin of the connector, respectively, to receive a USB bus signal, an output terminal of the USB control chip is connected to the signal terminals of the plurality of storage chips, to control the plurality of storage chips to read or write data according to the received USB bus signal.

2. The storage device of claim 1, wherein the connector is a USB3.0 connector.

3. The storage device of claim 1, wherein the connector is a male connector.

* * * * *